United States Patent [19]

Shimura

[11] Patent Number: 4,977,100

[45] Date of Patent: Dec. 11, 1990

[54] METHOD OF FABRICATING A MESFET

[75] Inventor: Teruyuki Shimura, Itami, Japan

[73] Assignee: Mitsubishi Denki Kabushiki Kaisha, Tokyo, Japan

[21] Appl. No.: 417,288

[22] Filed: Oct. 5, 1989

[30] Foreign Application Priority Data

Oct. 12, 1988 [JP] Japan ............................... 63-258007

[51] Int. Cl.$^5$ .................. H01L 21/265; H01L 21/311
[52] U.S. Cl. ....................................... 437/44; 437/41;
437/912; 357/15
[58] Field of Search ................. 437/912, 235, 41, 228,
437/44

[56] References Cited

U.S. PATENT DOCUMENTS

| | | | |
|---|---|---|---|
| 4,546,540 | 10/1985 | Ueyanagi et al. | 148/DIG. 143 |
| 4,782,031 | 11/1988 | Hagio et al. | 437/912 |
| 4,804,635 | 2/1989 | Young | 437/912 |
| 4,829,025 | 5/1989 | Iranmanesh | 437/228 |
| 4,839,311 | 6/1989 | Riley et al. | 437/7 |
| 4,843,024 | 6/1989 | Ito | 437/912 |
| 4,849,376 | 7/1989 | Balzan et al. | 437/41 |
| 4,855,246 | 8/1989 | Codella et al. | 437/44 |
| 4,859,618 | 8/1989 | Shikata et al. | 437/41 |
| 4,863,879 | 9/1989 | Kwok | 437/912 |
| 4,923,823 | 5/1990 | Kohno | 437/912 |

FOREIGN PATENT DOCUMENTS

| | | | |
|---|---|---|---|
| 101466 | 6/1983 | Japan | 437/907 |
| 61-154046 | 7/1986 | Japan | . |
| 62-92481 | 4/1987 | Japan | . |

Primary Examiner—Brian E. Hearn
Assistant Examiner—Linda J. Fleck
Attorney, Agent, or Firm—Leydig, Voit & Mayer

[57] ABSTRACT

A method of producing a MESFET which includes forming a refractory metal gate structure on an active layer formed in or on a semiconductor substrate. Source and drain regions optionally with extensions, are formed adjacent the gate structure. An insulating film is deposited over the partly formed structure to form a film portion on the semiconductor substrate which is separated from further film portions formed over the source and drain regions. A flattening resist is deposited over the insulating film and etched to expose only the film portion on the gate structure, while the gate structure itself and the resist protects the film portions on the source and drain regions. The film portion over the gate structure can thus be removed without damage to the gate structure or the remainder of the insulating film. The process produces with increased yield and more consistent properties in that the danger of attacking the refractory metal gate structure during operations succeeding its formation is significantly reduced.

20 Claims, 3 Drawing Sheets

METHOD OF FABRICATING A MESFET

FIELD OF THE INVENTION

This invention relates to semiconductor devices, and more particularly to semiconductor devices such as MESFET's which have a low resistance metal deposited onto a refractory gate metal to reduce gate resistance.

BACKGROUND OF THE INVENTION

A very important device of the type characterized generally above is the self-aligned gate MESFET. Self-aligned gate technology is adapted to enhance high frequency performance by using the gate as a mask to create the FET source and drain, thereby to obtain almost perfect alignment between those elements. In addition, as such circuits become miniaturized for purposes such as MMIC's (monolithic microwave integrated circuits), it is important to increase circuit density which requires precise alignment between multiple layers as they are deposited one upon the other during the semiconductor fabrication process.

The prior art has employed refractory metal gates as the mask or a portion of the mask for ion implantation steps. One prior art technique utilizing a refractory metal gate is described in connection with FIGS. 3(a)-3(h). Those figures show cross-sectional structures illustrating the process steps of one prior art method for producing a MESFET device.

FIG. 3(a) shows an early stage of device production in which an active layer 3 is formed in a semi-insulating GaAs substrate 1 by ion implantation An SiO$_2$ film (not illustrated) is first formed on the substrate 1 as a surface protection film having a thickness of about 300 Å. A resist pattern (not illustrated) is then formed onto the SiO$_2$ film and Si ions are implanted selectively through the SiO$_2$ film utilizing the resist pattern as a mask. The Si ions are implanted at about 50 keV to a concentration of 1.0 to 3.0$\times$10$^{12}$cm$^{-2}$. The resist pattern is removed and the implanted substrate 1 is annealed to form the active layer 3.

A refractory metal gate 2 is then formed by depositing an appropriate refractory metal alloy onto the active layer 3. The refractory metal layer 2 can be tungsten silicide (WSi), tungsten nitride (WN), tungsten silicon nitride (WSiN), or tungsten aluminum (WAl), for example, deposited onto the active layer 3 to a thickness of about 3000 Å. The gate metal 2 is patterned by a photoresist layer 4 which is exposed and processed to protect the gate region, while leaving the remaining areas of the layer 2 exposed to an etching process.

Referring to FIG. 3(b), it is seen that the gate electrode 2 has been formed by etching away the exposed portion of the layer 2 not covered by the photoresist layer 4 and then removing the remaining photoresist layer 4. The gate electrode 2 then serves as a mask for formation of an initial low ion concentration portion 5 of the source and drain regions.

Advancing to FIG. 3(c), an insulating film or layer (not illustrated) is formed over the entire surface of the substrate 1. The insulating layer is anisotropically etched such as by reactive ion etching (RIE) to form side walls 7 adjacent the gate 2. The side walls 7 and the gate 2 then are utilized as a mask to form high ion concentration source and drain regions 6, again by ion implantation. The insulating side walls 7 then are removed.

As shown in FIG. 3(d), an insulating film or layer 20 then is deposited over the substrate 1 and the gate 2 by a conventional plasma CVD technique. Following the deposition of the layer 20, a photoresist layer 9 is formed over the layer 20 to form a flat top surface, as illustrated in FIG. 3(e). The layer 9 and the layer 20 are formed such that they will etch at substantially the same rate.

The layers 9 and 20 are etched together under tightly controlled conditions until the top of the gate 2 is exposed as shown in FIG. 3(f). Next a resist layer 10 is patterned to leave an opening adjacent the gate 2 as illustrated in FIG. 3(g). Subsequently, a low resistance metal layer 11 is deposited on the gate 2 and the resist layer 10 (not illustrated). The metal layer 11 such as Ti/Mo/Au, is removed with the layer 10, such as by a conventional lift-off technique, leaving the low resistance contact 11, as shown in FIG. 3(h). It is seen that the low resistance gate contact 11 covers the gate 2 and overlaps the gate to cover portions of the insulating film 20 over the source and drain regions near the gate, including the low concentration source and drain regions 5.

In forming the prior art semiconductor devices, the resist 9 and the insulating film 20 must be etched at substantially equal rates and the etching process must be stopped at the stage shown in FIG. 3(f). The etching has to consistently be stopped such that the top of the gate 2 is just exposed. If the etching is continued, or is uneven, the gate metal 2 also will be etched away. This results in semiconductor devices which are not uniform and are not easily reproducible, which provides poor reliability of the semiconductor devices.

SUMMARY OF THE INVENTION

In view of the foregoing, it is a general aim of the present invention to produce a semiconductor device with uniform and reproducible characteristics formed in a more reliable manner than the prior art discussed above.

In that regard, it is an object of the present invention to provide an improved method of producing a semiconductor device having a low resistance layer formed on the gate which can be produced with greater reliability than such devices produced in the past.

In a more detailed aspect, it is an object of the present invention to produce a MESFET device while utilizing improved etching processes for exposing the top of the refractory gate metal.

In accomplishing these objects, the present invention employs a method of forming a MESFET in which an insulating film is formed over the gate structure and source and drain regions of a partially completed device, the insulating film being deposited in such a way as to produce a first portion over the gate structure which is separated from additional portions over the source and drain regions. In a particular embodiment of the invention, the gate can be formed in a T-shaped configuration from two different metals. The T-shaped configuration insures that the portion of the insulating film deposited on top of the gate is separated from the adjacent insulating film on the substrate. After the insulating film with separated portions is formed, a resist is deposited over the insulating film to form a flat etching surface. The resist is etched until the separate insulating film portion on the gate is exposed. The thickness of the separate insulating film portion provides an etching margin, to prevent etching of the gate metal and enhance the uniformity and reproducibility to produce semiconductor devices at a high yield. The separate insulating film portion then is removed without any substantial etching of the gate metal, and without attacking the portions of the insulating film overlying the source and drain regions, since such portions are protected, by the resist overlying the edges of the gate structure. The remaining resist is removed such as by an oxygen plasma and another etch resist is deposited and processed to define a contact area. The contact area preferably has a width greater than the gate, and the low resistance metal then is deposited and removed with the resist to leave only the desired low resistance contact over the gate and slightly overlying portions of the insulating film on the source and drain regions which abut the gate.

Other objects and advantages will become apparent from the following detailed description when taken in conjunction with the drawings, in which:

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Turning now to the drawings, FIGS. 1(a)-1(i) illustrate the major steps in producing a semiconductor device according the the present invention. An active layer 3 is produced in or on a semi-insulating GaAs substrate 1. In the illustrated embodiment, the active layer 3 is produced by first forming a $SiO_2$ film or layer (not illustrated) to a thickness of about 300 Å on top of the substrate 1. Silicon ions selectively are implanted through a resist pattern (not illustrated) at about 50 keV to a concentration of about 1.0 to $3.0 \times 10^{12} cm^{-2}$. The implanted substrate 1 then is annealed to produce the active layer 3. Having thus prepared the semiconductor substrate, materials then are applied to the substrate 1 for forming the structure of the semiconductor devices.

Figure 1A:
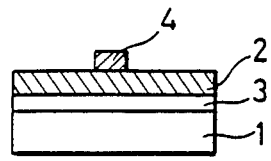
FIGS. 1(a)-1(i) are diagrams showing cross-sectional views in the major process steps of a method for producing a semiconductor device as an embodiment of the present invention.

As shown in FIG. 1(a), a refractory metal layer 2 is deposited onto the active layer 3, preferably to a thickness of about 3000 Å. The refractory metal layer 2 can be deposited by sputtering and can be, for example, tungsten silicide (WSi), tungsten nitride (WN), tungsten silicon nitride (WSiN) or tungsten aluminum (WAl).

Figure 1B:
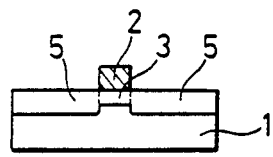

A photoresist layer (not illustrated) then is deposited on the gate metal layer 2 and patterned to form a gate photoresist mask 4 as shown in FIG. 1(a). The mask 4 is used to produce the gate 2 by etching away the exposed portions of the layer 2, as shown in FIG. 1(b). The gate 2, after the photoresist 4 is removed, then is utilized as a mask to form low ion concentration source and drain regions 5, again by ion implantation.

Figure 1C:
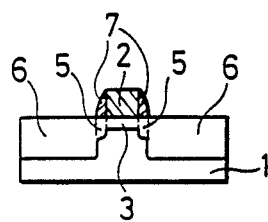

An insulating film (not illustrated) then is formed on the substrate 1 and etched preferably by an RIE technique to produce side walls 7 adjacent the gate 2, as shown in FIG. 1(c). The gate 2 and the side walls 7 are used as a mask for further ion implantation to produce high ion concentration source and drain regions 6. The side walls 7 then are removed.

Figure 1D:
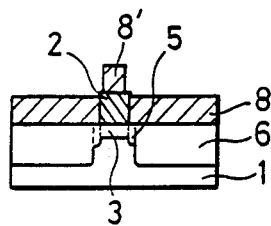

Referring to FIG. 1(d), an insulating film 8 is deposited over the gate 2 and the substrate 1, preferably by an Electron Cyclotron Resonance-Chemical Vapor Deposition (ECR-CVD) technique. The ECR-CVD technique is a particular form of available chemical vapor deposition technique, using a specialized means of exciting the plasma before deposition. It is useful in the present invention in that it does not form a continuous film in all cases (particularly when thin films are formed on uneven surfaces) in contrast to a conventional plasma chemical vapor deposition technique, but instead produces a "separated film" or a film of poor coverage as will be described in greater detail below. In particular, and referring to FIG. 1(d), the operation of the ECR-CVD technique produces the insulating layer 8, which has a portion 8' formed on the gate 2, which is separated from the portions of the layer 8 which were depicted on the source and drain regions. Because the film is grown on two different levels, i.e., on the source and drain region and on the raised gate, and because the deposition is stopped before the two levels have the opportunity to grow together, leaving separated film portions 8, 8', the coverage of the thus-formed film can be considered "bad coverage". Bad coverage is used herein to refer to the separated layers wherein a portion of the gate structure can be seen between the portions of the film 8' which overlie the gate and the additional portions 8 which overlie the source and drain regions. Such bad coverage is achieved in part by use of the ECR-CVD technique and in part by controlling the time of deposition using that technique to produce films of adequate thickness but without the growing together of the two separate layers 8, 8'.

Figure 1E:
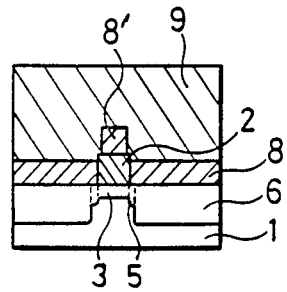
Figure 1F:
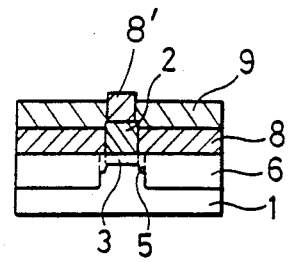

Having formed the separated protective insulating film, a flattening resist layer 9 then is deposited over the insulating layer 8, 8' to a thickness of about one micron, as shown in FIG. 1(e). The top surface of the layer 9 is flat to provide a substantially uniform flat etching surface. The resist layer 9 then is etched away until the top of the separate insulating layer portion 8' is exposed, as shown in FIG. 1(f). Since the thickness of the separate insulating layer portion 8' provides an etching margin, the etching technique can be a simple method at a normal temperature, such as an oxygen plasma etch or RIE technique.

Figure 1G:
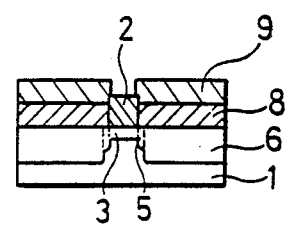
Figure 1H:
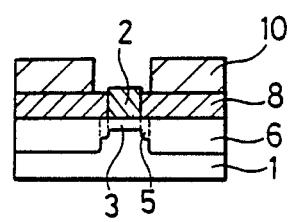

The separate insulating layer portion 8' then is removed by a wet etch, such as a solution of buffered hydrogen fluoride acid ($NH_yF + H_2O + HF$), as show in FIG. 1(g). It is important to note that the underlying portions of the insulating film 8 which cover the source and drain regions are protected during the removal of the upper portion 8' of the film. That protection is by way of the resist 9 which due to the incomplete coverage of the film 8, 8' overlies the gate structure in such a way as to prevent the lower portions 8 of the insulating film from being attacked by the etchant used to remove the upper portion 8' of the film. As will become more apparent from the following description, the integrity of the lower portion of the film 8 is important since the low resistance metal layer which is deposited on the gate structure overlies a portion of the insulating film (the region immediately over the gate and which overlies the low ion concentration regions 5 of the active layer). Thus, the integrity of the insulating film 8 at its interface with the gate 2 is important in preventing direct contact between the low resistance metal and the insulated portions of the source and drain regions. Having removed the upper portion 8' of the insulating film while leaving the lower portions 8 in place, the remaining resist layer 9 then also is removed without substantially affecting the gate 2. A resist layer (not illustrated) then is deposited and patterned to form a pattern 10 for depositing a low resistance metal, as illustrated in FIG. 1(h).

Figure 1I:
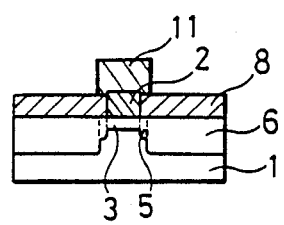
Figure 2A:
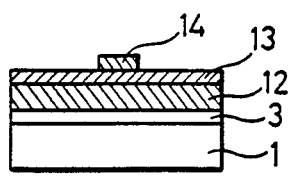
FIGS. 2(a)-2(i) are diagrams showing cross-sectional views in the major process steps of a method for producing a semiconductor device as a second embodiment of the present invention.
Figure 2B:
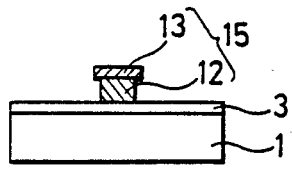
Figure 2C:
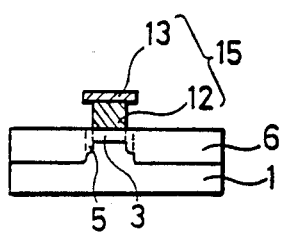
Figure 2D:
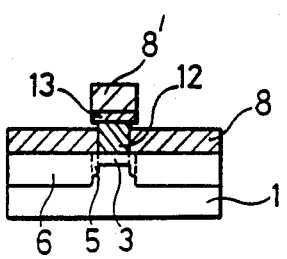
Figure 2E:
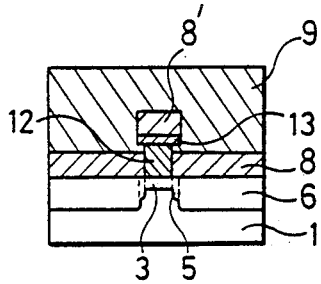
Figure 2F:
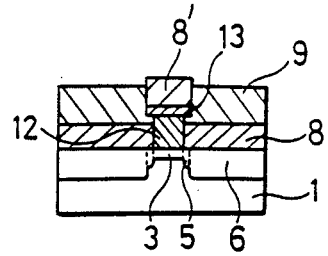
Figure 2G:
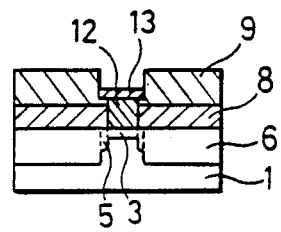
Figure 2H:
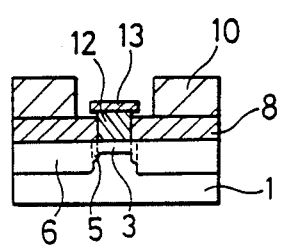
Figure 2I:
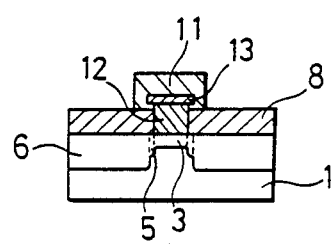

A low resistance metal layer (not illustrated) then is deposited over the gate 2 and the resist pattern 10. The low resistance metal layer can be vapor deposited and can be formed from, for example Ti/Mo/Au. The resist 10 and the low resistance metal layer formed thereon are removed, for example, by conventional lift off techniques. As shown in FIG. 1(i), a low resistance metal contact portion 11 remains deposited over the gate 2, and is seen to overlie portions of the source and drain region adjacent the gate, while being protected from contact with the underlying semiconductor by means of the integrity of the insulating film 8 which has remained in place during the aforementioned processing steps.

Figure 3A:
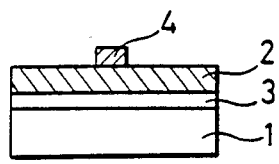
FIGS. 3(a)-3(h) show cross-sectional views of structures illustrating the process steps in a prior art method for producing a semiconductor device.
Figure 3E:
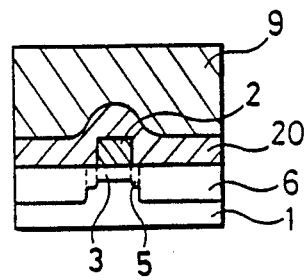
Figure 3B:
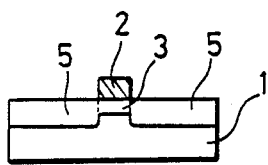
Figure 3F:
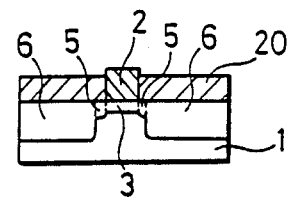
Figure 3C:
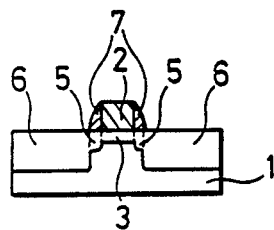
Figure 3G:
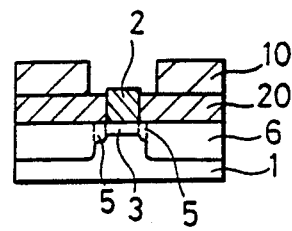
Figure 3D:
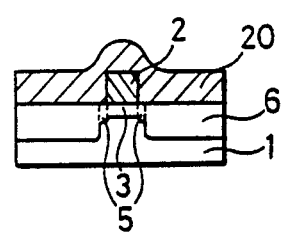
Figure 3H:
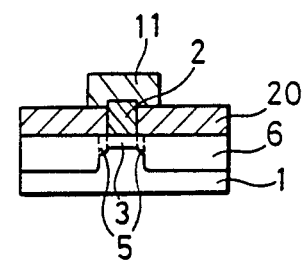

In the above described embodiment of the present invention, since the separate insulating layer portion 8 is produced on the gate 2 and the portion 8' and the layer 8 are both covered by the flattening resist 9, only the flattening resist 9 is required to be removed in the etching process. The poor coverage produces the separated insulating layer portion 8'. The thickness of the separate insulating layer portion 8' provides an etching margin which provides an improved uniformity and reproducibility of the etching process and hence for the semiconductor devices. A further improvement is provided, since if the production or the etching of the layer 9 is not uniform or becomes faulty, the layer 9 can be redeposited and the etching process repeated. This is not possible in the prior art embodiment (FIG. 3(f)), since if the etching is faulty, the gate 2 is directly affected and hence the device cannot be completed as desired.

In the above described embodiment, the refractory gate metal 2 has a rectangular cross-section. Turning now to FIGS. 2(a)-2(i), a second embodiment of the present invention is illustrated with a T-shaped cross-section gate 15, which is produced by utilizing two different gate metals.

FIGS. 2(a)-2(i) illustrate the major steps in producing a semiconductor device according to the present invention. The same reference numerals are utilized to designate the same or corresponding elements to those shown in the first embodiment. The semi-insulating semiconductor substrate 1 is prepared as before to produce the active layer 3 as shown in FIG. 1(a).

Departing from the first embodiment, a refractory metal silicide layer 12, such as tungsten silicide, is then deposited, such as by sputtering, on the substrate 1. A refractory metal layer 13, such as tungsten, is deposited on the refractory metal layer 12. A resist layer (not illustrated) then is deposited and patterned to form a mask 14 for producing the T-shaped gate structure 15.

As illustrated FIG. 1(b), the gate structure 15 formed by etching away the layers 12 and 13 forms a T-shaped cross section, since the metal of the layer 12 intentionally is selected to etch at a faster rate than the layer 13.

The subsequent process steps illustrated in FIGS. 2(b) to 2(i) are substantially the same as those described with respect to FIGS. 1(b) to 1(i). Two exceptions are provided by the T-shaped gate 15, since the ion implantation needed to form the region 5 must be accomplished at a slight angle to the perpendicular direction from the surface of the substrate 1. The angle is necessary to prevent the overlapping extensions of the layer 13 from blocking the regions adjacent the layer 12. However, the overlapping extensions of layer 13 allow the elimination of the masking insulator 7 and the steps necessary to form and remove the walls 7, since the overlapping extensions can be utilized as the mask when implanting the regions 6. In short, low ion concentration regions 5 are formed by ion implantation at a slight angle using the lower portion 12 of the gate structure as a mask, then the heavy concentration source and drain regions 6 are formed by ion implantation normal to the surface of the semiconductor, using the upper portion 13 of the gate structure as a mask. This technique provides a significant advantage over the additional processing steps required to produce the side walls 7.

In the second embodiment, the T-shaped gate 15 also insures the separation of the insulating layer portion 8' from the insulating layer 8. This also insures that the layer 9 will completely isolate the layer 8 from the portion 8' when it is removed, see FIG. 2(g). Thus, in addition to the separation in the film layers 8, 8' achieved by what has been characterized as the "poor coverage" of the ECR-CVD technique, further assistance is provided in separating the films by virtue of the overhang of the upper layer 13 caused by undercutting of the lower layer 12.

In the above illustrated embodiment, the different kinds of metals forming the gate structure 15 are an upper refractory metal layer 13 and a lower refractory metal silicide layer 12. The metals forming the gate structure 15 are not restricted to such a combination, but can include any combination of refractory metals which can be etched to form the T-shaped cross-section.

Also, although a semi-insulating GaAs substrate 1 was described, other substrates also can be utilized, such as an InP series substrate or a hetero-epitaxy substrate such as used in a High Electron Mobility Transistor (HEMT). Further, although an ECR-CVD technique was utilized to produce the poor coverage to form the separated film layers 8, 8', other techniques possibly can be utilized, especially with the T-shaped gate structure 15.

As is evident from the foregoing description, according to the present invention, an insulating film is deposited with poor coverage, which has a separate portion formed on the gate, which is not connected to the remaining insulating film on the substrate. Therefor, when the flattening resist is etched away, only the flattening resist is etched by a simple process until the separate portion of the insulating layer on the gate is exposed. The thickness of the separate portion provides an etching margin for the process. Thus, the refractory metal gate will not be etched, even though the etching process is faulty. If the etching process is faulty, the flattening resist can be deposited again and the etching process can be repeated. Further, the whole contact area is protected during the removal of the separate insulating film portion which ensures that the insulating film under the contact area is not affected by the etching process. This results in a superior process for producing semiconductor devices and enables production of the semiconductor devices at a high yield, since the process improves both the reliability and reproducibility of the resulting semiconductor devices. By forming a T-shaped gate structure, the separation of the insulating layer from the insulating layer portion on the gate is insured to provide a greatly enhanced yield. Also, the top of the T-shaped gate can be utilized as an etching mask to eliminate the process steps of forming and removing the side walls.

What is claimed is:

1. A method of producing a semiconductor MESFET, comprising:
   forming an active layer on one surface of a semiconductor substrate;
   forming a refractory metal gate structure on the active layer;
   implanting a source and a drain region in said semiconductor substrate utilizing at least said gate structure as a mask therefor;
   forming an insulating film on said semiconductor substrate with a film portion over said gate structure separated from film portions over the source and drain regions;
   forming a flattening resist over the insulating film and etching away said flattening resist until said separate insulating film portion on said gate structure is exposed;
   removing said insulating film portion on said gate structure while protecting the insulating film portions on the source and drain regions from removal, removing the remaining flattening resist to expose the protected insulating film portions; and
   depositing a low resistance metal on said gate structure and overlying a portion of the insulating film on the source and drain regions.

2. The method of claim 1 wherein said semiconductor substrate is a GaAs substrate.

3. The method of claim 1 wherein said semiconductor substrate is an InP series substrate.

4. The method of claim 1, including forming said refractory metal gate structure from a single metal layer.

5. The method of claim 4 including forming said refractory metal gate structure single layer from one of the group consisting of tungsten silicide, tungsten nitride, tungsten silicon nitride or tunsgten aluminum.

6. The method of claim 4 wherein implanting said source and drain regions include conducting ion implantation utilizing said single gate layer as a mask for producing low ion concentration diffusion regions, forming side walls on both sides of said single gate layer, and conducting ion implantation utilizing said single gate layer and said side walls as a mask for producing high ion concentration diffusion regions.

7. The method of claim 1 including forming said refractory metal gate structure from at least two layers of different refractory metals formed on one another.

8. The method of claim 7 including etching said gate structure layers to form a T-shaped structure with the top layer having portions which overhang the bottom layer.

9. The method of claim 8 wherein implanting said source and drain regions include conducting ion implantation utilizing said -bottom gate structure layer as a mask for producing low ion concentration diffusion regions and conducting ion implantation utilizing said overhanging portions of said top gate structure layer as a mask for producing high ion concentration diffusion regions.

10. The method of claim 1 including forming said insulating film by utilizing an ECR-CVD technique.

11. The method of claim 1 including etching said flattening resist by utilizing an oxygen plasma.

12. The method of claim 1 including etching said flattening resist by utilizing reactive ion etching.

13. The method of claim 1 wherein said low resistance metal is Ti/Mo/Au.

14. A method of producing a semiconductor MESFET comprising:
    forming an active layer on one surface of a semiconductor substrate;
    forming a T-shaped refractory metal gate structure on the active layer, the T-shaped gate structure being formed of at least two layers of different refractory metals, the upper layer being wider than the lower layer;
    implanting a source and a drain region in said semiconductor substrate utilizing at least said gate structure as a mask therefor;
    forming an insulating film on said semiconductor substrate with a film portion over said gate structure separated from film portions over the source and drain regions;
    forming a flattening resist over the insulating film and etching away said flattening resist until said separate insulating film portion on said gate structure is exposed;
    removing said insulating film portion on said gate structure while protecting the insulating film portions on the source and drain regions from removal, removing the remaining flattening resist to expose the protected insulating film portions; and
    depositing a low resistance metal over the top layer of said gate structure and overlying a portion of the insulating film on the source and drain regions.

15. The method of claim 14 including forming said refractory metal gate structure by forming a lower layer of refractory metal silicide on said semiconductor substrate and forming an upper layer of refractory metal on said lower layer.

16. The method of claim 15 including forming said upper layer from tungsten and forming said lower layer from tungsten silicide.

17. The method of claim 15 including forming said T-shaped refractory metal gate structure by depositing a refractory metal silicide layer and a refractory metal layer successively on said active layer, and etching both of said layers with a gate structure resist mask to produce said T-shaped refractory metal gate structure due to said refractory metal silicide layer etching faster than said refractory metal layer.

18. The method of claim 14 including forming said insulating film by utilizing an ECR-CVD technique.

19. The method of claim 14 including etching said flattening resist by utilizing an oxygen plasma.

20. The method of claim 14 including etching said flattening resist by utilizing reactive ion etching.

* * * * *